(12) United States Patent
Bertrand

(10) Patent No.: US 7,078,982 B2
(45) Date of Patent: Jul. 18, 2006

(54) METHOD AND DEVICE FOR EMITTING PULSES ON AN ELECTRICITY DISTRIBUTION NETWORK

(75) Inventor: Paul Bertrand, Pierrefeu Du Var (FR)

(73) Assignee: Watteco, La Garde (FR)

( * ) Notice: Subject to any disclaimer, the term of this patent is extended or adjusted under 35 U.S.C. 154(b) by 48 days.

(21) Appl. No.: 10/997,307

(22) Filed: Nov. 24, 2004

(65) Prior Publication Data

US 2005/0280559 A1    Dec. 22, 2005

(30) Foreign Application Priority Data

Jun. 21, 2004    (FR) .................................. 04 06727

(51) Int. Cl.
- H03K 7/00 (2006.01)
- H02J 3/02 (2006.01)
- H04L 25/00 (2006.01)

(52) U.S. Cl. .......................... 332/106; 307/3; 375/257; 375/259

(58) Field of Classification Search ................ 332/106, 332/112–114; 307/3; 340/310.11, 310.12; 375/257, 259
See application file for complete search history.

(56) References Cited

U.S. PATENT DOCUMENTS

| | | | |
|---|---|---|---|
| 3,714,451 A | 1/1973 | Whitney et al. | |
| 4,090,184 A | 5/1978 | Hamilton, II | |
| 4,982,175 A | 1/1991 | Streater | |
| 5,483,153 A | 1/1996 | Leeb et al. | |
| 5,486,805 A | 1/1996 | Mak | |
| 5,614,811 A | 3/1997 | Sagalovich et al. | |
| 5,691,691 A * | 11/1997 | Merwin et al. | ............. 375/259 |
| 2002/0024423 A1 | 2/2002 | Kline | |
| 2003/0156014 A1 | 8/2003 | Kodama et al. | |

FOREIGN PATENT DOCUMENTS

| | | |
|---|---|---|
| EP | 1 136 829 A1 | 9/2001 |
| GB | 1153908 A | 6/1969 |
| GB | 2 008 299 A | 5/1979 |
| WO | WO 00/26679 A1 | 5/2000 |

* cited by examiner

Primary Examiner—David Mis
(74) Attorney, Agent, or Firm—Akin Gump, Strauss Hauer & Feld, LLP

(57) ABSTRACT

A method for emitting a predetermined series of pulses on an electricity distribution network carrying a determined voltage includes linking an electric element to the network by a switch and supplying a control signal to the switch. The switch is driven by the control signal, such that high frequency spurious pulses are emitted at the rate of the control signal. According to one embodiment, the control signal is data bearing, such that data-bearing high frequency spurious pulses are emitted at the rate of the control signal.

33 Claims, 5 Drawing Sheets

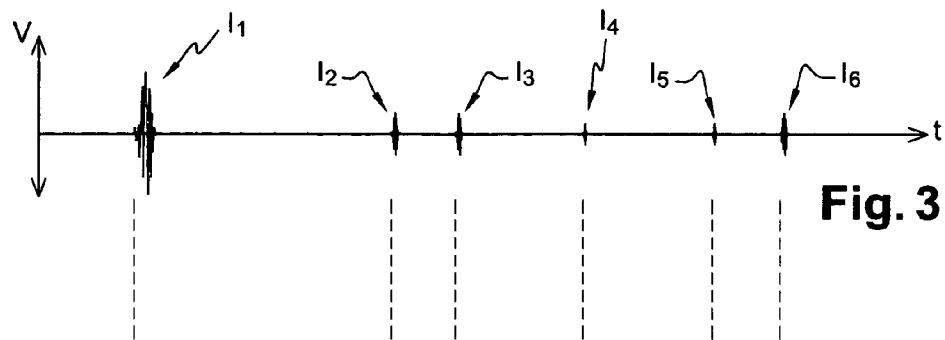
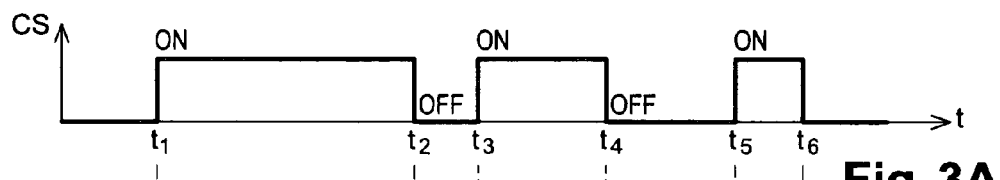
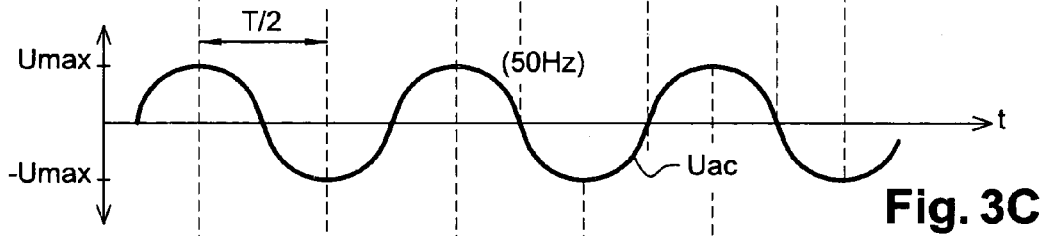
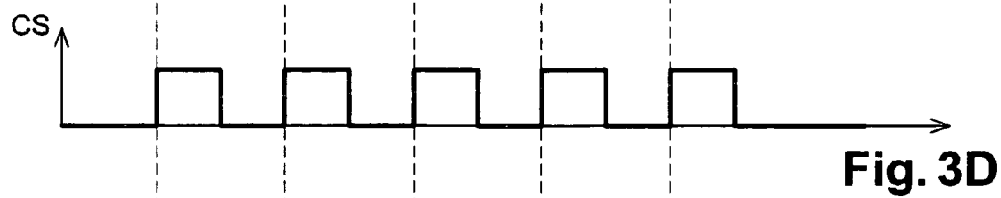
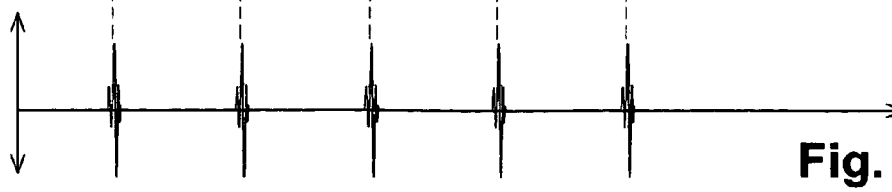

METHOD AND DEVICE FOR EMITTING PULSES ON AN ELECTRICITY DISTRIBUTION NETWORK

BACKGROUND OF THE INVENTION

The present invention relates to a method and a device for emitting a predetermined series of pulses on an electricity distribution network.

The present invention is initially based on ideas and principles set forth in European Patent Application Publication No. EP 1,136,829, the contents of which are incorporated by reference herein. As set forth in this document, any electric apparatus or element, particularly engines, pumps, transformers, electric bulbs, electric or electronic circuits, relative to its electric supply input, has a complex impedance and generates, when switched on and switched off, a high frequency spurious signal having an electromagnetic origin. As this signal is very short in duration, it is designated, in the present application, as forming a "high frequency spurious pulse" naturally emitted by an electric element.

EP 1,136,829 is based on the fact that such a pulse forms a sort of unique signature representative of a piece of electric apparatus and of its location on the electricity distribution network, enabling it to be differentiated from other electric apparatus. EP 1,136,829 thus provides a method for measuring the electrical power consumption of a piece of electric apparatus connected to an electricity distribution network, wherein the step of detecting the switching on or off of the electric apparatus comprises a step of detecting the high frequency pulse emitted by the apparatus when it is switched on or off, enabling the apparatus to be identified.

EP 1,136,829 also considers, when a piece of electric apparatus only produces a spurious pulse of low amplitude, providing a pulse generator capable of supplying a pulse that replaces the spurious pulse that is too weak. EP 1,136,829 also considers that such a pulse generator can emit a series of pulses comprising a determined number of pulses forming a unique signature, and combining a detection of spurious pulses naturally emitted by certain pieces of apparatus with a detection of the series of pulses emitted artificially by other apparatus equipped with such a pulse generator.

As also indicated in EP 1,136,829, the production of a pulse synthesizer capable of emitting a coded series of pulses having the same appearance as high frequency spurious pulses is, per se, within the understanding of those skilled in the art. One embodiment of such a synthesizer comprises for example a high frequency (HF) switch, an HF oscillator, a logic circuit and an output transformer. The HF oscillator supplies a high frequency signal for switching the HF switch. The logic circuit supplies a coded signal that is mixed with the switching signal to obtain a signal for controlling the switch corresponding to the coded series of pulses to be emitted. The output transformer enables the series of HF pulses artificially reconstituted to be re-injected into the electricity distribution network.

However, the cost price and overall dimension of such a pulse synthesizer are substantial in the context of the intended applications, which may be a concern of mass markets who demand very low cost prices.

It is well known that the electric line has been used for many years as a low-rate data transmission means, particularly in home automation applications, to remotely control electric appliances (such as electric shutters for example). The known data transmission methods involve injecting, into the network, a carrier signal of higher frequency than the voltage of the network (generally 50 Hz or 60 Hz), which is modulated appropriately to carry data. A disadvantage of these methods is that they require the injection of such a carrier signal. They are therefore intrusive and cause interference.

It is desirable to integrate a pulse synthesizer into a domestic appliance or other commonplace device at the lowest cost and with minimum overall dimension.

Thus, in furtherance of the ideas disclosed by the aforementioned EP 1,136,829, it is desirable to provide a method and a device for emitting high frequency pulses of the same type as those naturally emitted by electric apparatus when they are switched on.

To that end, it is also desirable to cause high frequency spurious pulses to be emitted by an electric element by controlling the production of the spurious pulses using a switch driven by a control signal, instead of seeking to artificially reconstitute such pulses.

BRIEF SUMMARY OF THE INVENTION

Thus, the present invention comprises a method for transmitting data via the electricity distribution network, which is less intrusive and causes less interference than the known methods.

The present invention also comprises controlling the production of high frequency spurious pulses by an electric element by means of a switch that is driven by a data-bearing signal.

Thus, data are transmitted on an electricity distribution network by using high frequency spurious pulses naturally emitted by an electric element, without requiring a pulse synthesizer. It shall be noted that the duration of such pulses of electromagnetic origin, that is very short, is independent of the time elapsing between the closing and opening of the switch, which can be much longer.

The present invention also includes a method for emitting a predetermined series of pulses on an electricity distribution network carrying a determined voltage, wherein the pulses are high frequency spurious pulses emitted naturally by an electric element that is linked to the network by a switch means. The electric element naturally emits a high frequency spurious pulse when it is connected to the network by the closing of the switch means. The switch is driven by a control signal of determined shape corresponding to the series of pulses to be emitted, such that the high frequency spurious pulses are emitted at the rate of the control signal.

According to one embodiment, this method is used for transmitting data via the electricity distribution network and the switch means is driven by a control signal bearing data, such that data-bearing high frequency spurious pulses are emitted at the rate of the control signal.

According to one embodiment, the electricity distribution network carries an alternating voltage and the control signal is synchronized with the waveform of the alternating voltage, so that the switch is only closed when the alternating voltage is in the vicinity of its peak value.

According to one embodiment, the alternating voltage is considered to be in the vicinity of its peak value when it has an amplitude at least equal to 50% of its peak value.

According to one embodiment, the control signal is synchronized with the waveform of the alternating voltage so that the switch is only open when the alternating voltage is in the vicinity of zero.

According to one embodiment, the control signal consists of pulses of constant duration for closing/opening the switch means, each closing/opening pulse comprising a rising edge and/or a high level causing a change in the open or closed state of the switch and a falling edge and/or a low level causing a reverse change in the state of the switch.

According to one embodiment, the control signal comprises closing/opening pulses of a duration less than 1/8th of the period of the alternating voltage.

According to one embodiment, the control signal is a coded data-bearing signal.

According to one embodiment, the electric element is a capacitor, a resistance, a light-emitting diode or a combination of at least two of these elements.

According to one embodiment, the method comprises receiving the high frequency spurious pulses and reconstituting the control signal, wherein spurious pulses of an amplitude below a determined threshold, corresponding to pulses emitted upon the opening of the switch, are not taken into account to reconstitute the control signal.

According to one embodiment, the receiving step comprises the production of a signal mirroring the voltage carried by the electricity distribution network, the high-pass filtering of the mirroring signal, the sampling of the mirroring signal according to a determined sampling window, for obtaining digital samples of the mirroring signal, and the analysis of the samples of the mirroring signal for detecting the presence of high frequency spurious pulses.

The present invention also comprises a method for remotely measuring the local electricity consumption of an electric device connected to an electricity distribution network carrying a determined voltage. The method includes measuring the electricity consumption of the device by means of an on-board current sensor and sending a piece of information relating to the electricity consumption measured performed in accordance with the method according to the present invention.

The present invention also comprises a method for identifying an electric device connected to an electricity distribution network carrying a determined voltage. The method includes emitting a series of high frequency spurious pulses forming a code for identifying the device.

According to one embodiment, the electric device is a circuit-breaker, and the emission of the identification code is only triggered when the circuit-breaker has tripped.

The present invention also comprises a device that emits pulses on an electricity distribution network carrying a determined voltage. The device includes an electric element and a switch that links the electric element to the electricity distribution network. The electric element naturally emits high frequency spurious pulses when it is connected to the network by the closing of the switch means, and means for supplying to the switch a control signal of determined shape corresponding to a series of pulses to be emitted, such that high frequency spurious pulses are emitted at the rate of the control signal.

According to one embodiment, the device is used for transmitting data via the electricity distribution network. The device includes a control signal generator that supplies a control signal representative of the data to be emitted to the switch, such that the data-bearing spurious pulses are emitted at the rate of the control signal.

According to one embodiment, the device comprises a control signal generator that supplies a coded control signal representative of the data to be emitted to the switch.

According to one embodiment, the device is provided for an electricity distribution network carrying an alternating voltage. The device includes a monitoring circuit that monitors the amplitude of the alternating voltage, supplies a signal for authorizing pulse emitting having a determined value when the alternating voltage is in the vicinity of its peak value, and circuitry that only closes the switch when the signal for authorizing pulse emitting has the determined value.

According to one embodiment, the monitoring circuit supplies a signal for authorizing pulse emitting having the determined value when the amplitude of the alternating voltage is at least equal to 50% of its peak value.

According to one embodiment, the monitoring circuit includes a rectifier that supplies a single- or full-wave rectified voltage, the amplitude of which is representative of the amplitude of the alternating voltage, and a comparator that receives a reference voltage at one input and the rectified voltage at another input and supplies the signal for authorizing data sending.

According to one embodiment, the control signal generator supplies a control signal consisting of pulses of constant duration for closing/opening the switch, each pulse comprising a rising edge and/or a high level causing a change in the open or closed state of the switch and a falling edge and/or a low level causing a reverse change in the state of the switch.

According to one embodiment, the control signal generator supplies closing/opening pulses of a duration at least less than 1/8th of the period of the alternating voltage.

According to one embodiment, the electric element is a capacitor, a resistance, a light-emitting diode (LED) or a combination of at least two of these elements.

According to one embodiment, the switch is a triac, a metal-oxide semiconductor (MOS) transistor or a relay.

According to one embodiment, the control signal is supplied by a microcontroller or a microprocessor.

According to one embodiment, the device comprises a measuring circuit that measures current and is arranged for sending a piece of information, in the form of high frequency spurious pulses, relating to a current measured.

The present invention also comprises a device for exchanging information via an electricity distribution network carrying a determined voltage, an emitting device for that emits high frequency spurious pulses according to the present invention, and a receiving device that receives the high frequency spurious pulses. The receiving device includes a circuit that reconstitutes the control signal.

According to one embodiment, the receiving device comprises a filtering or rejecting circuit that rejects spurious pulses of an amplitude below a determined threshold, corresponding to pulses caused by openings of the switch, so as not to take these pulses into account when reconstituting the control signal.

According to one embodiment, the device is provided for an electricity distribution network carrying an alternating voltage, and the receiving device comprises a mirror circuit that supplies a signal mirroring the alternating voltage, and a high-pass filter that filters the mirroring signal to extract the high frequency spurious pulses therefrom.

According to one embodiment, the receiving device comprises an antenna that detects the high frequency spurious pulses by using an electromagnetic component of the spurious pulses.

According to one embodiment, the data receiving device comprises a sampling circuit that samples the signal received, and an analyzing circuit that analyzes the samples of the signal received to detect the presence of high frequency spurious pulses.

The present invention also provides a circuit-breaking device having a closed state and an open state, and a pulse-emitting device according to the present invention that emits a determined series of pulses when the circuit-breaking device is in the open state.

According to one embodiment, the circuit-breaking device comprises a switch with pilot light that switches from the open state to the closed state when the circuit-breaking device switches from the closed state to the open state, and all or part of the pulse-emitting device is electrically powered through the switch with pilot light, such that the pulse-emitting device is inactive while the circuit-breaker is in the closed state.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIGS. 3A–3B are timing diagrams generally showing a method according to the present invention;

FIG. 3C represents the waveform of a voltage distributed by an electricity distribution network;

FIGS. 3D–3E are timing diagrams of signals showing a first embodiment of the method according to the present invention;

DETAILED DESCRIPTION OF THE INVENTION

Figure 1:
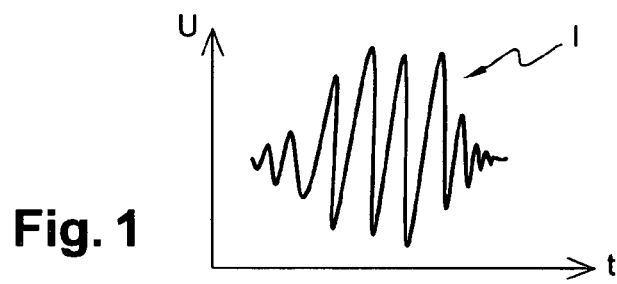
FIG. 1 represents the appearance of a high frequency spurious pulse.

FIG. 1 represents the appearance of a spurious pulse I emitted naturally by an electric element when it is switched on. Such a spurious pulse is independent of the electricity consumption of the electric element and takes the shape of a high frequency alternating wave train, typically of a frequency in the order of 20 MHz. The duration of this spurious pulse I is of several hundreds of nanoseconds, typically 250 nanoseconds. The amplitude U of the spurious pulse I ranges from about ten millivolts (mv) to several Volts (under a voltage of 220 Volts) according to the reactive component of the element and the power it absorbs. At reception, due to the limitations of the bandwidth of the measuring channels (measurement equipment and distribution network), the pulses collected are broader and on the order of about ten microseconds, i.e., a broadening by a factor 40 of the initial pulse.

As indicated above, the present invention proposes controlling the emission of high frequency spurious pulses by way of an electric element, to obtain a series of pulses having a desired profile, instead of artificially reproducing such pulses.

Figure 2:
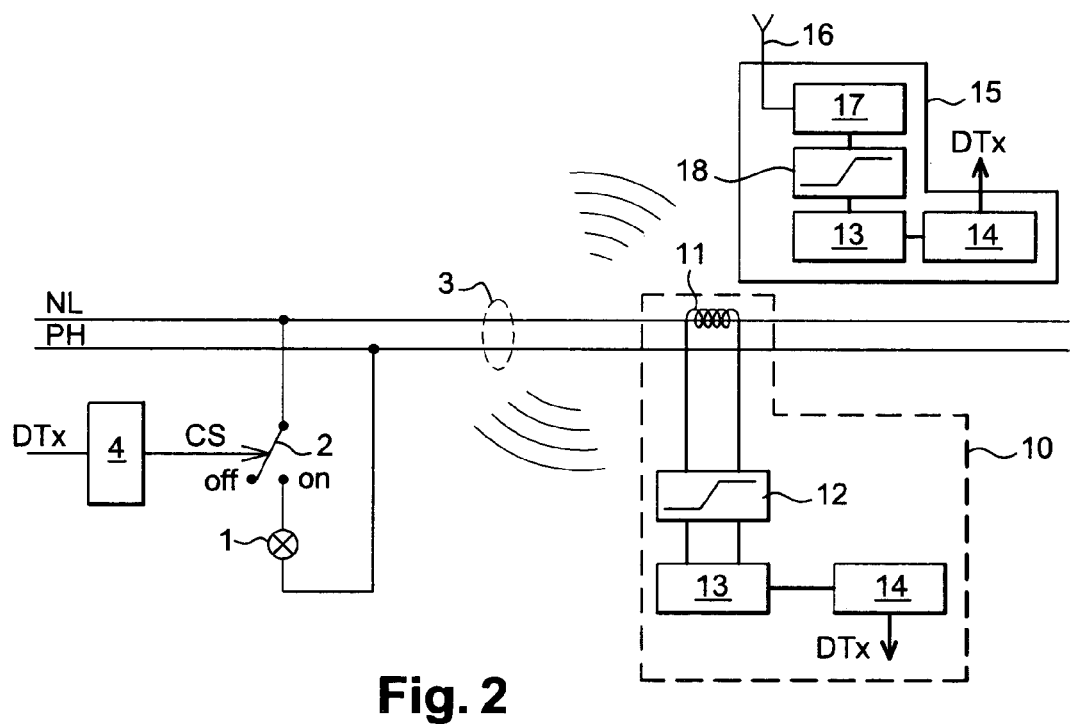
FIG. 2 schematically represents a device implementing the method according to the present invention.

FIG. 2 diagrammatically shows a circuit that implements the method according to the present invention. An electric element 1 is linked through a switch 2 to an electricity distribution network 3 carrying an alternating voltage Uac (FIG. 3C). The network 3 is here single phase and the electric element 1 is linked to the phase wire (PH) and to the neutral wire (NL) of the network. The switch 2 is interposed between the phase wire and the corresponding terminal of the electric element 1. The switch 2 comprises a control terminal to which a control signal CS is applied. The control signal CS controls the closing and the opening of the switch.

The switch 2 is of any appropriate type. For example the switch 2 may be a monostable switch of normally open type such as a metal-oxide semiconductor (MOS), a bipolar transistor, a monostable relay and the like, or the switch 2 may be a bistable switch such as a triac, a bistable relay and the like. The control signal is generated by a control signal generator 4.

The element 1 can be any type of electric element producing spurious pulses of desired form (i.e., duration, amplitude, etc.), such as an electric bulb, a light-emitting diode (LED), a capacitor, a high value resistance or a combination of these elements. The electric element 1 preferably has a high impedance to avoid the appearance of a high switching current on the network. The electric element is for example a 250V capacitor having a relatively low capacitance (C) value and a high impedance Z ($Z=1/2\pi FC$) at the frequency (F) of the voltage Uac which is generally 50 or 60 Hz.

The control signal CS is a signal with two states "1" and "0", the "1" corresponding to a determined control voltage and the "0" corresponding to another determined control voltage, that can be the ground potential. For convention, as used herein, the switch 2 is closed (on) when the signal CS is 1 (monostable switch) or when the signal CS changes from 0 to 1 (bistable switch) and that the switch is open (off) when the signal CS on 0 or changes from 1 to 0. Other logic states may be utilized to open and close the switch 2. As will be seen below, the signal CS is capable of being applied directly to the control terminal of the switch or through a driver stage. Thus, within the meaning of the present invention, the signal CS represents the logic control signal of the switch 2. The control signal CS can constitute the primary control signal of the switch 2, i.e. the signal that is effectively applied to the control terminal of the switch 2, if it is compatible with the electrical characteristics of the control terminal of the switch 2.

In summary, the method according to the present invention is based on the emission of high frequency pulses designated here and in the claims as being "spurious" pulses, to distinguish them from pulses produced artificially. However, the term "spurious" does not mean that the method according to the present invention produces interference and is therefore incompatible with regulations for limiting pollution on electric networks. On the contrary, due to the very short duration of the spurious pulses, as a data transmission method, the method according to the present invention is less "intrusive" and less interfering than classical data transmission methods based on the injection of a carrier signal into the electric network.

FIGS. 3A–3C show aspects of the method according to the present invention in greater detail. FIG. 3A represents an example of any shape of signal CS and FIG. 3B represents the amplitude, in Volts, of the high frequency spurious pulses produced on the network 3. FIG. 3C represents the waveform of the voltage Uac at the moment at which the spurious pulses are emitted. Upon each change from the state 0 to the state 1 of the signal CS, the switch 2 turns on, the electric element 1 receives the voltage Uac and a closing spurious pulse I1, I3, I5 is emitted. Upon each change from the state 1 to the state 0 of the signal CS, the switch 2 changes into the open state (OFF), the element 1 is disconnected from the network 3 and an opening spurious pulse I2, I4, I6 is emitted.

By jointly observing FIGS. 3B and 3C, it can be seen that the amplitude of the spurious pulses is not constant and depends, in particular, on the moments at which these pulses are emitted. More particularly, experimental observations having an impact on the implementation of the method have brought the following phenomena to light:

Phenomenon No. 1: the amplitude of the closing or opening spurious pulses depends on the amplitude of the voltage Uac at the moment at which the closing or the opening of the switch 2 occurs; and Phenomenon No. 2: in similar emission conditions, the opening spurious pulses have an amplitude below that of the closing spurious pulses and do not generally exceed 10% of the amplitude of the closing spurious pulses.

Thus, in accordance with phenomenon No. 1, it can be seen in FIG. 3B that the closing spurious pulse I1 is maximal since it is emitted at an instant t1 at which the voltage Uac is equal to its peak value Umax (i.e., a spurious pulse of same amplitude would be obtained with the peak value −Umax). Furthermore, the closing spurious pulses I3, I5 are emitted at instants t3, t5 at which the voltage Uac has a low amplitude, and have an amplitude much lower than that of the pulse I1. Similarly, the opening spurious pulse I4 is emitted at an instant t4 at which the voltage Uac is below its peak value Umax or −Umax, and has an amplitude below that of the opening spurious pulse I2.

In accordance with phenomenon No. 2, it can further be seen that the opening spurious pulse I2, although emitted at an instant t2 at which the voltage Uac is maximal (i.e., in the same condition), has an amplitude clearly below that of the spurious pulse I1. Finally, in accordance with the combination of phenomena No. 1 and No. 2, it can be seen that the opening spurious pulse I6 is emitted at an instant t6 at which the voltage Uac is maximal (−Umax) and has an amplitude higher than those of the closing spurious pulses I3, I5 that are emitted in unfavourable conditions, despite the fact that they would have a higher amplitude if they were emitted in the same conditions.

From all of these observations, it follows that the implementation of the method according to the present invention is based on two preferential rules:

1) The opening spurious pulses are not considered to be "exploitable", as they have an amplitude that is too low relative to the closing spurious pulses. Thus, these pulses I1, I2, I3, I4, I5, I6 will be neutralized at emission, in a way described below, or rejected at reception, in a way also described below.

2) The closing spurious pulses I1, I3, I5 are emitted when the voltage Uac is close to the maximum value, i.e., when the voltage Uac has an amplitude higher than or equal to x % of the value Umax, x being a parameter to be defined experimentally and preferably at least equal to 50.

FIGS. 3D–3E show a first embodiment of the method according to the present invention, wherein the opening spurious pulses are neutralized at emission. FIG. 3D represents the shape of the signal CS and FIG. 3E represents the amplitude of the pulses obtained. The signal CS is synchronized with the waveform of the voltage Uac, represented in FIG. 3C. More particularly, the signal CS changes to 1 when the voltage Uac is equal to Umax or −Umax and changes to 0 when the voltage Uac is zero. In other terms, the switch 2 changes from the closed state to the open state when the voltage Uac is zero and the opening spurious pulses I2, I4, I6 are never emitted, as can be seen in FIG. 3E. However, the amplitude of the closing spurious pulses I1, I3, I5 is maximal since the switch 2 is only closed at the instants at which the voltage Uac is maximal.

It will be understood that the profile of signal CS represented in FIG. 3D only constitutes a template determining the authorized instants of closing and opening of the switch 2. Thus, various series of pulses each having their own profile can be emitted, and each profile can be allocated to the identification of a determined electric appliance, as was considered by EP 1,136,829 but by using synthesis pulses.

According to one aspect of the present invention, this template is used to transmit data. For example, as shown in FIG. 2, data DTx to be sent, possibly in coded form, are applied to a circuit 4 that supplies the control signal CS while monitoring the voltage Uac. The data DTx can be sent bit by bit or as a frame comprising one start bit and 8 data bits for example, and possibly a signature field, such as a parity bit. In the absence of coding, a closing of the switch 2 (i.e., the emission of a spurious pulse I1–I6) corresponds to sending a bit on 1, while the absence of closing of the switch 2 at the moment imposed by the template, i.e., an absence of any spurious pulse, corresponds to sending a bit on 0.

In a 50 Hz network, the period T of the voltage Uac is of 20 ms, such that 100 spurious pulses (i.e. 100 non-coded bits) can be sent in one second. Although this pulse rate is slow, it is sufficient for certain identification or data transmission applications, particularly an application such as managing a stock of streetlights described below.

Figure 4A:
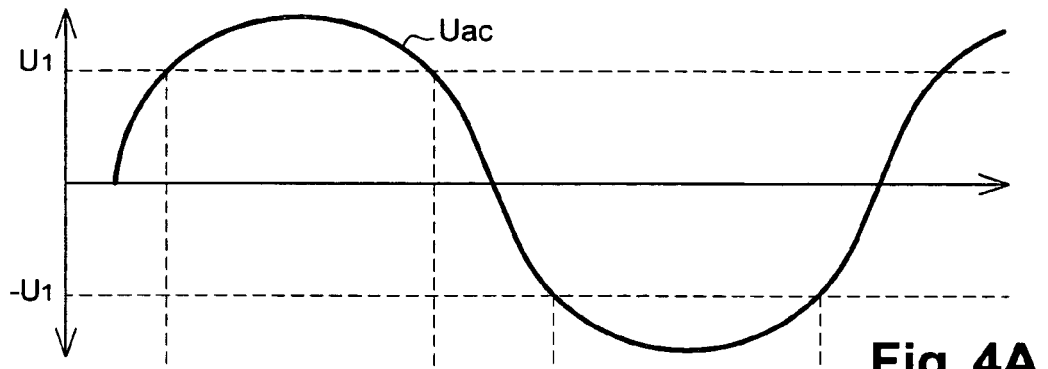
FIG. 4A represents, with an expanded time scale, the waveform of a voltage distributed by an electricity distribution network.
Figure 4B:
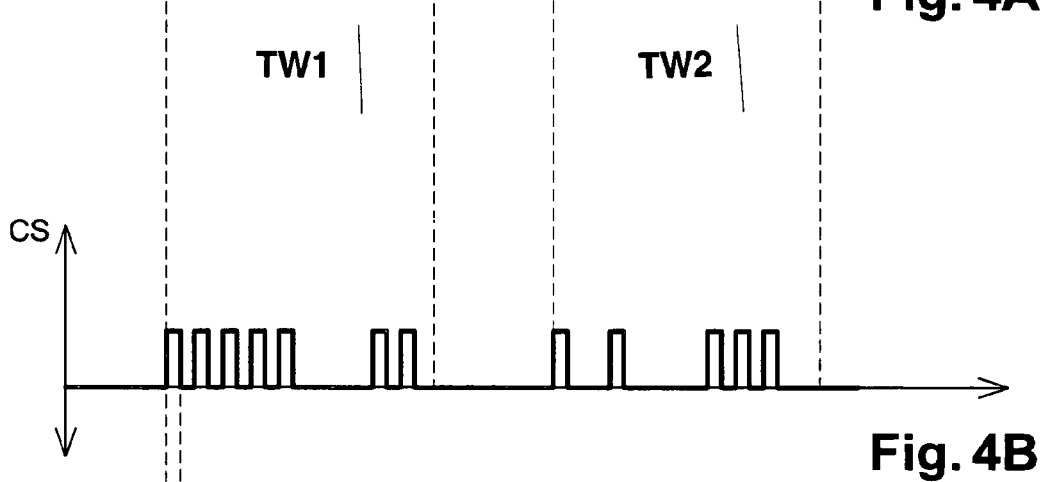
FIGS. 4B–4C are timing diagrams of signals showing a second embodiment of the method according to the present invention.
Figure 4C:
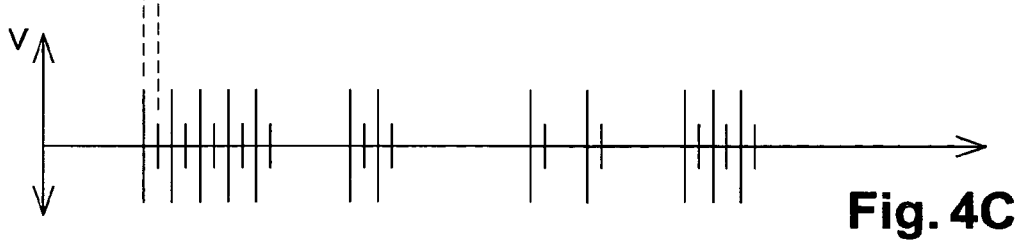

A second embodiment of the method according to the present invention is, furthermore, provided for sending data or trains of pulses with a higher rate. This embodiment is shown by FIGS. 4A–4C. Here, the closing spurious pulses are not neutralized at emission and are ignored at reception, thanks to an adequate setting of a detection threshold. To determine the instants for authorizing the emission of the spurious pulses, a threshold U1 close to the peak value Umax is chosen, for example a threshold equal to 0.66 Umax. As represented in FIG. 4A, the threshold enables two time windows for authorizing emission TW1, TW2 to be defined, at each half-period T/2 of the voltage Uac. The window TW1 encompasses the values of the voltage Uac that are positive and higher than U1 and the window TW2 encompasses the values of the voltage Uac that are negative and lower than −U1 (i.e., higher than U1 in absolute value). FIG. 4B represents the template of the control signal CS. The latter comprises trains of closing/opening pulses that are only applied to the switch 2 inside each time window TW1, TW2. As can be seen in FIG. 4C, each closing/opening pulse causes the emission on the network of two high frequency spurious pulses, i.e., a closing spurious pulse upon the rising edge of the closing/opening pulse and an opening spurious pulse upon the falling edge of the closing/opening pulse. As indicated above, the opening spurious pulses have an amplitude much lower than that of the closing spurious pulses and are destined to be filtered at reception.

With a voltage Uac of frequency 50 Hz, the duration of the windows TW1, TW2 is on the order of 6 to 7 ms and the number of closing/opening pulses that can be sent is high. Thus, if each closing/opening pulse causes the emission of two high frequency spurious pulses of a duration in the order of 10 microseconds each (pulse width at reception, useful signal), the minimum duration of each closing/opening pulse must be at least equal to twice the duration of the spurious pulses, i.e. in the order of 10 to 20 microseconds. In these conditions, by choosing this minimum pulse duration as a template, and without taking into account any limitations of the switch 2 in terms of switching frequency, each time window TW1, TW2 can contain approximately 300 closing/opening pulses and thus offers a high data rate relative to the first embodiment of the method of the present invention, on the order of 30,000 pulses per second.

As discussed above, the data DTx can be sent in raw form, i.e., one bit corresponding to one pulse, or coded by any appropriate coding protocol, i.e, one bit corresponding to several pulses. The data DTx, whether coded or not, can be sent in the form of individual bits or as a frame comprising a start of frame field, a data field, and possibly an end of frame field that can comprise a verification field of CRC or parity type.

It will be understood by those skilled in the art that various alternative embodiments and applications of this method are possible. For example, the emission of the high frequency spurious pulses can be provided only once per period instead of twice per period, for example when the voltage Uac is equal to +Umax (first embodiment) or is higher than +U1 (second embodiment).

FIG. 2 also schematically represents two examples of embodiment of pulse detectors 10, 15 according to the present invention.

The detector 10 is an inductive reception device the operating principle of which has already been described in EP 1,136,829. It comprises an input transformer for extracting from the voltage Uac a mirroring signal that is analyzed to detect the high frequency spurious pulses. The transformer can be simply formed by a coil 11 arranged around the phase wire (PH) of the network 3, at a source point of the distribution of the current, for example near an electricity meter. The coil 11 supplies the mirroring signal that is applied to a high-pass filter 12 to remove its low frequency alternating component. The output of the filter 12 is applied to a sample hold analog-to-digital converter 13 ("sample hold AD converter") that supplies digital samples of the filtered voltage Uac in synchronization with a sampling period defining an observation window. The choice of the sampling period and of the duration of the observation window depends on the period of emission of the high frequency spurious pulses, i.e., the period between two closing/opening pulses. If the spurious pulses are emitted with a high frequency, in accordance with the second embodiment of the method of the present invention, the observation window is chosen to be sufficiently short to obtain a fineness of analysis enabling the pulses to be differentiated within the pulse trains emitted. The analysis of the samples of the voltage Uac is performed by an analysis circuit 14, generally a specific logic circuit, which analyzes the amplitude of the samples received and detects the pulses of an amplitude above the threshold for rejecting the closing spurious pulses, so as to keep only the opening spurious pulses. The analysis circuit 14 thus reconstitutes the control signal CS, and also deduces therefrom the data DTx when the signal CS is data bearing. If they are received in coded form, the data DTx can also be decoded by the analysis circuit 14.

The detector 15 is a contactless device comprising an antenna 16, an antenna booster 17 and a high-pass filter 18 for removing the signals of frequency below that of the pulses to be detected. In addition to these elements, as above, a sample hold AD converter 13 and an analysis circuit 14 are provided. This embodiment of a pulse detector according to the present invention is based on the fact that the high frequency spurious pulses are found both as electric pulses on the network and as electromagnetic pulses that can be detected in the same way as any radio frequency signal. The detector 15 is preferably arranged near the pulse-emitting equipment, such as in the premises in which the equipment is installed for example.

Figure 5:
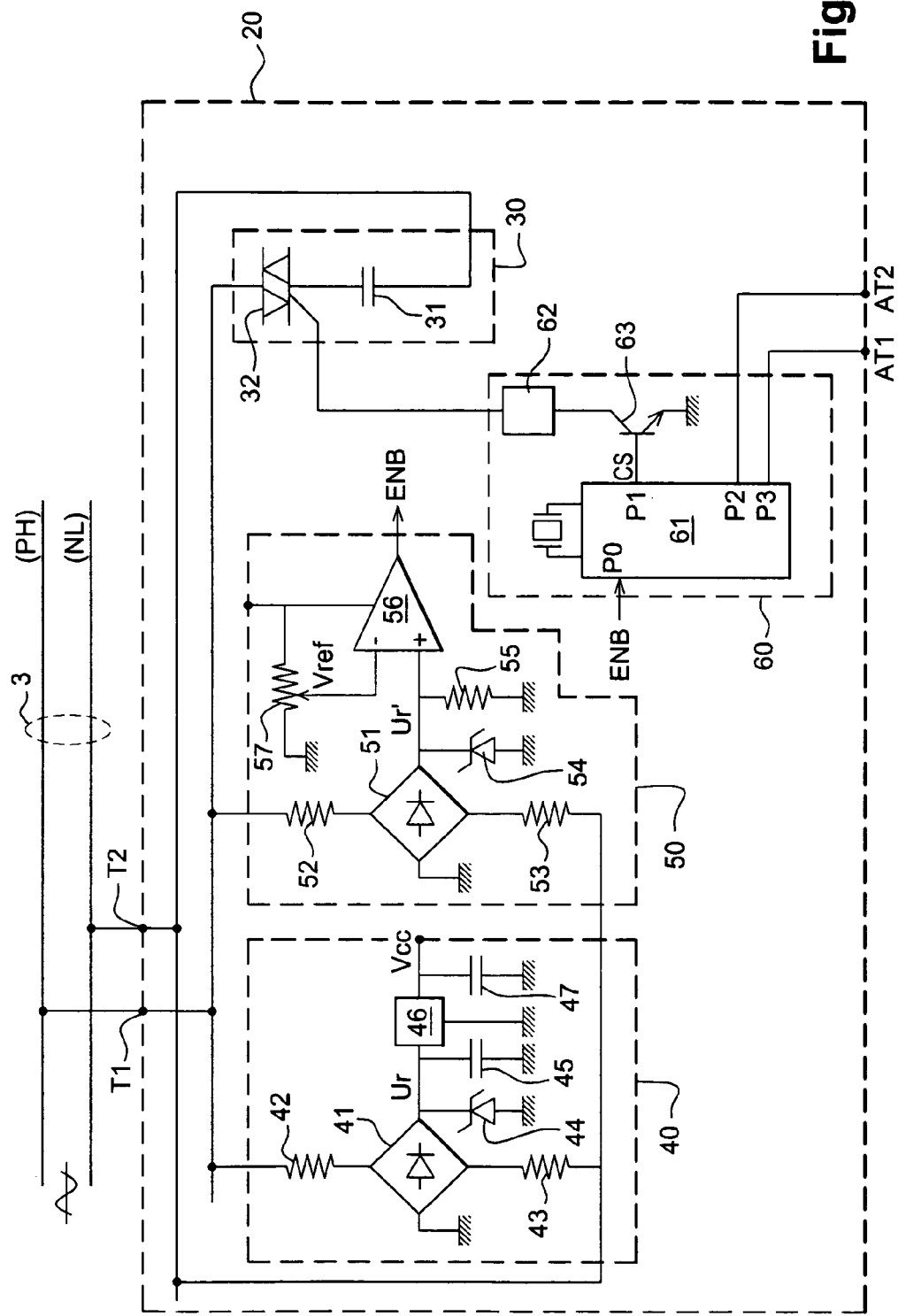
FIG. 5 is the wiring diagram of an example of embodiment of a pulse-emitting device according to the present invention.

FIG. 5 represents one simple and inexpensive embodiment of a pulse-emitting device 20 according to the present invention, intended to be installed on-board apparatus or in electric equipment.

The device 20 comprises two terminals T1, T2 for connection to the electricity distribution network 3, a switch circuit 30, an electric supply circuit 40, a circuit 50 for monitoring the alternating voltage Uac and a control circuit 60. The terminal T1 is connected to the phase wire (PH) and the terminal T2 connected to the neutral wire (NL) of the network 3. In accordance with the method of the present invention, the switch circuit 30 comprises an electric element 31, here a capacitor, and a switch 32. The switch 32 is for example a triac or a MOS transistor (a triac being represented in FIG. 5). The switch 32 has one terminal connected to the terminal T1, another terminal connected to one terminal of the capacitor 31, and a control terminal (trigger of the triac or gate of the MOS transistor) driven by the control circuit 60. The other terminal of the capacitor 31 is connected to the terminal T2.

The supply circuit 40 comprises a diode bridge rectifier 41 having two input terminals connected to the terminals I1, I2 through resistances 42, 43, a terminal linked to the ground and an output terminal supplying a full-wave rectified voltage Ur. The voltage Ur is applied to one input of an adjusting assembly 46 that is linked to the ground through an overvoltage clipper diode 44 and a smoothing capacitor 45. The output of the adjusting assembly 46 is linked to a stabilisation capacitor 47 and supplies a voltage Vcc for supplying the circuits 50, 60.

The monitoring circuit 50 comprises a diode rectifier bridge 51 having two input terminals connected to the terminals I1, I2 through resistances 52, 53, respectively, a terminal linked to the ground and an output terminal supplying a full-wave rectified voltage Ur'. The rectified voltage Ur' is applied to the positive input of a differential amplifier 56 that is linked to the ground through an overvoltage clipper diode 54 and a load resistor 55. The negative input of the amplifier 56 receives a reference voltage Vref supplied by the mid-point of a potentiometer 57 the anode of which receives the voltage Vcc and the cathode of which is grounded. The differential amplifier 56, here operating as a comparator, supplies a signal ENB ("Enable") that is 1 (Vcc) when the full-wave rectified voltage Ur' is higher than the reference voltage Vref, and is 0 (ground) in the opposite case. The potentiometer 57 enables the voltage Vref to be adjusted so as to define the width of the emission-authorizing time windows TW1, TW2. By increasing the voltage Vref, the width of the windows TW1, TW2 decreases and two authorization instants are finally obtained corresponding to Uac=Umax and Uac=−Umax, corresponding to the implementation of the first embodiment of the method according to the present invention (i.e. one pulse per half-period of the voltage Uac). The monitoring circuit 50 may comprise only a single-wave rectifier if pulses are only to be emitted on one of the two half-periods of the voltage Uac.

The circuit 60 supplies the control signal CS applied to the control terminal of the switch 32. The circuit 60 comprises microcontroller 61, incorporating on the same silicon microchip a microprocessor and its input/output ports P0, P1, P2, P3, etc., a program memory, data memories, a quartz oscillator and the like. Port P0 receives the signal ENB, port P1 supplies the control signal CS, ports P2 P3 are, optionally, used as ports for communicating with the microcontroller for test, maintenance, programming or other operations and are linked to auxiliary terminals AT1, AT2 of the device 20.

The microcontroller 61 detects the change to 1 of the signal ENB by polling the port P0 or by interruption declared on this port. Port P1 drives the switch 32 through a driver stage comprising a control block 62 and a transistor 63. The control block 62 has an output connected to the control terminal of the switch 32 and an input connected to the collector of the transistor 63. The emitter of the transistor 63 is connected to the ground and the base of the transistor 63 receives the control signal CS.

Once on-board a piece of electric apparatus, the device 20 can be used to transmit data or, more simply, to emit a series of non-data-bearing pulses, having an invariable predetermined profile, used for example to identify the electric apparatus. In this last case, the circuit 60 can be a logic circuit with a basic architecture, comprising a synchronization input receiving the signal ENB and supplying the control signal CS. By providing a microcontroller or microprocessor 61, it is possible to implement more complex applications requiring processing and transmitting data, as will be seen in the examples of applications described below.

Thus, various applications of the device 20 are possible. One example of an application is the control of streetlights in a built-up area. To that end, each streetlight is equipped with such a device 20 and cyclically sends a piece of information about its on or off state. This piece of information can be sent at low rate in accordance with the first embodiment of the method of the present invention, since it is not urgent and can be processed over periods of time of several minutes. With a reasonable investment, hundreds of streetlights can be equipped with devices 20 according to the present invention. By giving each streetlight one second every minute to emit pulses representative of the state of the streetlight, sixty (60) streetlights can send information in one minute. A reception unit 10 arranged at a source point of the urban electricity distribution network or at a bypass node, is sufficient to receive the information sent by a plurality of streetlights.

Various alternative embodiments of the pulse-emitting device according to the present invention can, furthermore, be made according to the intended applications.

Figure 6:
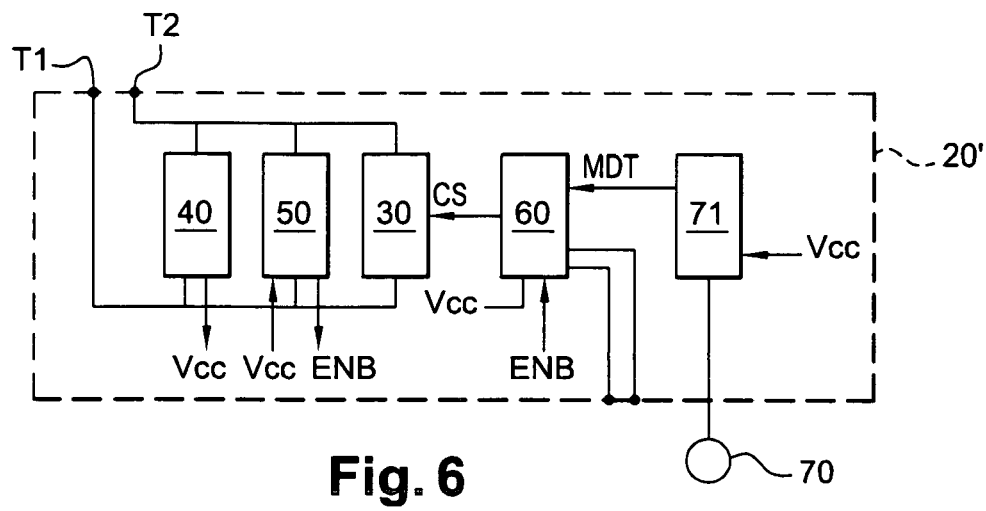
FIG. 6 is a block diagram depicting another embodiment of a pulse-emitting device according to the present invention.

FIG. 6 represents a device 20' that comprises, in addition to the circuits 30, 40, 50 and 60 that have just been described, a current sensor 70 linked to a measuring circuit 71. The measuring circuit 71 sends the control circuit 60 data relating to current measurements taken by the sensor 70. The microcontroller 61 of the device 60 analyzes the results of the measurements and decides whether or not to send them according to what is provided in the application program loaded into its program memory. This program can for example provide for the microcontroller 61 to send a piece of information on the network 3 relating to the current measured solely when the latter changes from 0 to a non-zero value, then changes from one consumption bracket to another, for example from the bracket ranging from 0 to 1 A to the bracket ranging from 1 to 2 A, from the bracket ranging from 1 to 2 A to the bracket ranging from 2 to 3 A, etc. This piece of information can take the shape of an eight-bit word (byte) having a first value when the current measured changes from 0 to a non-zero value, then a second value when the current changes from the bracket 0–1 A to the bracket 1–2 A, etc.

The device 20' can be arranged in an electric plug, particularly a piggyback plug used to electrically supply one or more pieces of equipment, or the device 20' can be installed on-board a piece of electric apparatus, so as to measure the current passing through the electric plug or the current consumed by the apparatus in which it is installed. Such an application enables the method of measuring the electricity consumption of electric apparatus described by EP 1,136,829 to be perfected. Indeed, when the current changes from 0 to a non-zero value, the emission of the first byte enables the piece of apparatus or the group of apparatus that is switched on to be identified on the network. Then, the emission of bytes in relation with the change in consumption bracket enables the consumption and locating measurements taken on the network in the manner proposed by EP 1,136, 829 to be confirmed.

Another example of application of the method and device according to the present invention will now be described.

Many industrial installations comprise circuit-breakers grouped together in electric cabinets, the closed (switched on) or open (tripped) state of which must be monitored. To that end, circuit-breakers have been developed that are equipped with a switch with pilot light which, through a mechanical actuator, switches from the open state to the closed state when the circuit-breakers trip. Thus, in such installations, the many circuit-breakers arranged in electric cabinets each have a switch with pilot light linked by two wires to a central controller or centralizer, which monitors the state of the circuit-breakers to detect power failures.

The present invention proposes removing the quantities of electric wires linking the switches with pilot light to the central controller, by installing on-board a circuit-breaker, a device according to the present invention that is arranged to monitor the state of the circuit-breaker and to send a piece of information when the circuit-breaker is in the open state. This piece of information can, for example, consist in a code for identifying the circuit-breaker, the simple emission of which means that the circuit-breaker has tripped.

Figure 7:
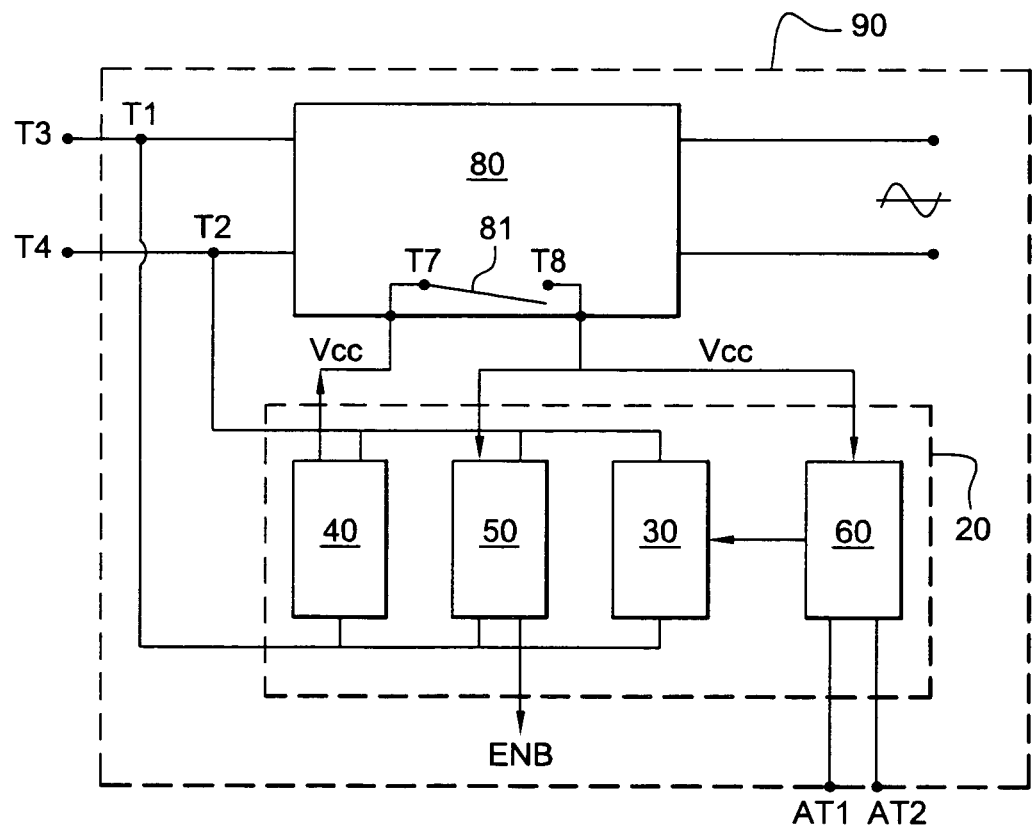
FIG. 7 is a block diagram depicting a circuit-breaker according to the present invention.

FIG. 7 represents an example of embodiment of a circuit-breaker 90 according to the present invention, comprising a combination of a classical circuit-breaker 80 and a device 20 according to the present invention. The structure of the device 20 is identical to the one described with respect to FIG. 5 and will not be described again. The circuit-breaker 80 comprises input terminals T3, T4 connected to the phase and neutral wires of the upstream part of the electricity distribution network 3, and output terminals T5, T6 connected to the phase and neutral wires of the downstream part of the electricity distribution network 3. The circuit-breaker 80 also comprises control terminals T7, T8 linked to the terminals of a switch with pilot light 81. The terminals T1 and T2 of the device 20 are connected to the terminals T3 and T4 of the circuit-breaker 80 such that the device 20 is electrically powered when the circuit-breaker 80 is in the open state.

The detection by the device 20 of the state of the circuit-breaker 80, is here performed by means of the switch with pilot light 81. Such a detection can be performed in various ways. For example, the microcontroller 61 of the control circuit 60 can comprise two input/output ports connected to the terminals T7, T8 to cyclically monitor the on or off state of the switch with pilot light 81. However, this solution has the disadvantage that the device 20 must permanently be switched on, and implies consuming electricity.

One advantageous solution, represented in FIG. 7, is that the supply voltage Vcc supplied by the circuit 40 is applied to the monitoring circuit 50 and to the control circuit 60 through the switch with pilot light 81. Thus, the device 20 stays switched off while the circuit-breaker is in the triggered state. When the switch with pilot light 81 closes, the circuits 50, 60 are electrically powered and the control circuit 60 implicitly "knows", when it is switched on, that a piece of information must be sent on the electric network. The control circuit 60 is therefore simply programmed for emitting, when it is switched on, a series of pulses enabling the circuit-breaker 80 to be identified. Generally speaking, the integration of the device 20 into a circuit-breaker 80 to obtain the circuit-breaker 90 according to the present invention involves only a minor increase in the cost price of the circuit-breaker, and enables, in return, substantial savings to be made on wiring as a result of removing the electric wires linking the central controller and the circuit-breakers 80. A pulse receiver of the type described above enables a wireless centralizer to be produced that is capable of managing hundreds of circuit-breakers 80 and of supplying, in real time, an indication about the circuit-breakers 80 that are in the tripped state.

In light of the examples described, it will be understood by those skilled in the art that various other alternative embodiments and applications of the present invention are possible. In particular, although various applications of the method of the present invention to an electricity network carrying an alternating voltage have been described, the present invention is also applicable to direct current networks, particularly the 400V DC networks used in industry or on board ships, the 200V DC networks, including the low voltage 12V DC networks present in motor vehicles. In particular, the method according to the present invention can be used to cause a vehicle device (such as a car headlamp for example) to send a piece of information about its state (on, off, out of order, etc.). In the applications to direct current networks, the monitoring of the waveform of the voltage carried by the network is no longer necessary since as this voltage is direct, it always has an optimal value for the emission of the high frequency spurious pulses.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A method for emitting a predetermined series of pulses on an electricity distribution network carrying a determined voltage comprising:
   linking an electric element to the network by a switch, the electric element naturally emitting a high frequency spurious pulse when it is connected to the network by the closing of the switch means, and
   supplying a control signal of determined shape corresponding to the series of pulses to be emitted to the switch, such that high frequency spurious pulses are emitted naturally by the electric element on the electricity distribution network at the rate of the control signal.

2. A method according to claim 1, wherein the switch is driven by a control signal bearing data, such that data-bearing high frequency spurious pulses are emitted at the rate of the control signal.

3. A method according to claim 2, wherein the electricity distribution network carries an alternating voltage and wherein the control signal is synchronized with the waveform of the alternating voltage so that the switch is only closed when the alternating voltage is proximate a peak value.

4. A method according to claim 3, wherein the alternating voltage is proximate the peak value when the alternating voltage has an amplitude at least equal to 50% of the peak value.

5. A method according to claim 3, wherein the control signal is synchronized with the waveform of the alternating voltage so that the switch is only open when the alternating voltage is about zero.

6. A method according to claim 2, wherein the control signal includes pulses of constant duration for closing/opening the switch, each closing/opening pulse comprising at least one of a rising edge and a high level that causes a change in the open or closed state of the switch and at least one of a falling edge and a low level that causes a reverse change in the state of the switch.

7. A method according to claim 6, wherein the electricity distribution network carries an alternating voltage and wherein the control signal comprises closing/opening pulses of a duration less than ⅛th of the period of the alternating voltage.

8. A method according to one of claims 2, wherein the control signal is a coded data-bearing signal.

9. A method according to claim 2, wherein the electric element is one of a capacitor, a resistor, a light-emitting diode (LED) and a combination of at least two of a capacitor, a resistor and an LED.

10. A method according to claim 2, further comprising:
    receiving the high frequency spurious pulses and reconstituting the control signal, wherein spurious pulses of an amplitude below a determined threshold, corresponding to pulses emitted upon the opening of the switch, are not taken into account to reconstitute the control signal.

11. A method according to claim 10, wherein the receiving step comprises the production of a signal mirroring the voltage carried by the electricity distribution network, the high-pass filtering of the mirroring signal, the sampling of the mirroring signal according to a determined sampling window, for obtaining digital samples of the mirroring signal, and the analysis of the samples of the mirroring signal for detecting the presence of high frequency spurious pulses.

12. A method for remotely measuring the local electricity consumption of an electric device connected to an electricity distribution network carrying a determined voltage comprising:
    measuring the electricity consumption of the device using an on-board current sensor; and
    sending a piece of information relating to the electricity consumption measured performed in accordance with the method according to claim 2.

13. A method for identifying an electric device connected to an electricity distribution network carrying a determined voltage comprising:
emitting a series of high frequency spurious pulses forming a code for identifying the device, performed in accordance with the method according to claim 2.

14. A method according to claim 13, wherein the electric device is a circuit-breaker, and wherein the emission of the identification code is only triggered when the circuit-breaker has tripped.

15. A device that emits pulses on an electricity distribution network carrying a determined voltage comprising:
an electric element and a switch that links the electric element to the electricity distribution network, the electric element naturally emitting high frequency spurious pulses when connected to the network by the closing of the switch; and
a control signal generator that supplies a control signal of determined shape corresponding to a series of pulses to be emitted to the switch, such that high frequency spurious pulses are emitted at the rate of the control signal.

16. A device according to claim 15, wherein the control signal is representative of the data to be emitted, such that the data-bearing spurious pulses are emitted at the rate of the control signal.

17. A device according to claim 16, wherein the control signal is a coded control signal representative of the data to be emitted.

18. A device according to claim 16, further comprising:
a monitoring circuit that monitors the amplitude of the alternating voltage and supplies an authorization signal that authorizes pulse emitting having a determined value when the alternating voltage is in the vicinity of its peak value, circuitry that only closing the switch when the authorization signal has the determined value.

19. A device according to claim 18, wherein the monitoring circuit supplies an authorization signal that authorizes pulse emitting having the determined value when the amplitude of the alternating voltage is at least equal to 50% of the peak value.

20. A device according to claim 18, wherein the monitoring means comprise a rectifier that supplies a single- or full-wave rectified voltage the amplitude of which is representative of the amplitude of the alternating voltage, and a comparator that receives a reference voltage at one input and the rectified voltage at another input, supplies the authorization signal that authorizes data sending.

21. A device according to claim 16, wherein the control signal generator supplies a control signal consisting of pulses of constant duration for closing/opening the switch, each pulse comprising at least one of a rising edge and a high level causing a change in the open or closed state of the switch and at least one of a falling edge and a low level causing a reverse change in the state of the switch.

22. A device according to claim 18, wherein the control signal generator supplies closing/opening pulses of a duration at least less than ⅛th of the period of the alternating voltage.

23. A device according to claim 16, wherein the electric element is a capacitor, a resistor, a light-emitting diode (LED) or a combination of at least two of a capacitor, a resistor and an LED.

24. A device according to claim 16, wherein the switch is a one of triac, a metal-oxide semiconductor (MOS) transistor and a relay.

25. A device according to claim 16, wherein the control signal is supplied by one of a microcontroller and a microprocessor.

26. A device according to claim 16, further comprising:
measuring circuit that measures current, the measuring circuit being configured to sending a piece of information in the form of high frequency spurious pulses relating to a current measured.

27. A device that exchanges information via an electricity distribution network carrying a determined voltage comprising:
an emitting device that emits high frequency spurious pulses according to claim 16, and
a receiving device that receives the high frequency spurious pulses, the receiving device including an extracting circuit that extracts a signal from the voltage carried by electricity distribution network, a detecting circuit that detects the presence of high frequency spurious pulses and a reconstituting circuit that reconstitutes the control signal.

28. A device according to claim 27, wherein the receiving device further includes a filtering circuit that rejects spurious pulses of an amplitude below a determined threshold, corresponding to pulses caused by openings of the switch, so as not to take spurious pulses into account when reconstituting the control signal.

29. A device according to claim 27, wherein the receiving device further includes a mirror circuit that supplies a signal mirroring the alternating voltage, and a high-pass filtering circuit that filters the mirroring signal, to extract the high frequency spurious pulses therefrom.

30. A device according to claim 27, wherein the receiving device further includes an antenna that detects the high frequency spurious pulses by using an electromagnetic component of the spurious pulses.

31. A device according to claim 27, wherein the data receiving device further includes a sampling circuit that samples the signal received, and an analyzing circuit that analyzes the samples of the signal received to detect the presence of high frequency spurious pulses.

32. A circuit-breaking device having a closed state and an open state, and comprising a pulse-emitting device according to claim 15, for emitting a determined series of pulses when the circuit-breaking device is in the open state.

33. A circuit-breaking device according to claim 32, comprising a switch with pilot light that switches from the open state to the closed state when the circuit-breaking device switches from the closed state to the open state, and wherein at least a part of the pulse-emitting device is electrically powered through the switch with pilot light, such that the pulse-emitting device is inactive while the circuit-breaker is in the closed state.

* * * * *